June 27, 1967 H. RIETH 3,328,701

ALL CHANNEL TELEVISION TUNER

Filed Sept. 16, 1963 2 Sheets-Sheet 1

INVENTOR.
HAROLD RIETH

BY

OSTROLENK, FABER, GERB & SOFFEN
ATTORNEYS

ALL CHANNEL TELEVISION TUNER

Filed Sept. 16, 1963 2 Sheets-Sheet 2

INVENTOR.
HAROLD RIETH
BY
OSTROLENK, FABER, GERB & SOFFEN
ATTORNEYS

United States Patent Office 3,328,701
Patented June 27, 1967

3,328,701
ALL CHANNEL TELEVISION TUNER
Harold Rieth, Santa Monica, Calif., assignor to Standard Kollsman Industries Inc., Melrose Park, Ill., a corporation of Illinois
Filed Sept. 16, 1963, Ser. No. 308,997
6 Claims. (Cl. 325—459)

This invention relates to all-channel television tuners, and more particularly relates to novel combination UHF–VHF frequency selectors.

Heretofore combination UHF–VHF tuners were essentially two separate tuners merged into one, one for VHF and the other for UHF. Such tuners were aligned in tandem and had costly and involved common dial drive and shaft arrangements. An attempt was made to simulate a single tuner as to operation and appearance. However, the size, cost, and components of such prior composite tuners were equivalent to two separate tuners. Also, in operating the tuner one had to set the VHF dial to a predetermined UHF position in order to operate the UHF section.

At best prior combination tuners had marginal performance at UHF reception due to a rather high noise figure. The VHF reception was satisfactory. However, the deteriorated UHF noise figure was primarily due to the absence of RF amplification preceding the crystal mixer in the UHF circuitry. In the prior combination UHF–VHF tuners, a change-over switch normally converted the RF tube and the mixer tube of the VHF stage into an IF amplifier stage for VHF amplifier use. It further disconnected the VHF antenna, and connected the input of the converter stage to the output of the separate UHF tuner. The plate voltage was also connected to the separate UHF oscillator tube in the tuner in order to put the UHF circuit in operation.

Further, the plate voltage from the VHF oscillator tube was disconnected to prevent interference in the UHF operation. It is thus noted that two separate oscillator tubes were required with the complex switching. Also, to prevent excessive cost an RF amplifier tube was not used in the UHF arrangement resulting in undue oscillator radiation as well as low UHF gain. In fact, in practice, at the highest UHF channels, for example 80 to 83, extremely high noise and in fact loss of input signal occurs in conventional combination tuners.

In accordance with the present invention I provide a composite VHF–UHF tuner with common circuitry, and with the frequency selection means arranged on unitary 360° sectors; the VHF section of which subtends 180°, and the UHF the balance of the sectors. The VHF selection is afforded by 12 indexed steps for the 12 VHF channels; and the 70 UHF channels are tuned across a UHF transmission line, as will be set forth hereinafter. A common tuning shaft is utilized for the composite UHF–VHF tunable sectors of the invention system rotatable over 360°.

The electrical circuitry of the invention composite tuner operates the same for both the UHF and VHF channels, and accordingly requires no changeover switching. The electrical changeover from UHF to VHF operation is afforded through adjustable inductors between channel 13 of the VHF section and channel 14 at the start of the UHF sections. The UHF transmission lines of the invention tuner are operated over a continuous path throughout the UHF channels. The same contactors are used for selection of the discrete VHF channel tunable positions and the continuous UHF transmission line positions.

Further, in accordance with the present invention a common oscillator is used, as is a common RF amplifier. Thus oscillator radiation common to prior UHF tuners is eliminated as a problem; and gain is presented to all the UHF positions with a minimum noise figure. Vernier control is used for both bands effective on the common oscillator circuits, and operated through a common vernier shaft for all channel operation.

The invention all-channel tuner is truly a single package tuner with no shields, sections, or other restrictions between the UHF and the VHF, which otherwise would complicate, enlarge, or increase the cost of the combination tuner. The invention tuner has a minimum of wiring, components, and drive mechanisms. In fact, it outwardly looks like a VHF tuner in size and shaft control. It is operated over a 360° swing, and the existing channels 2 to 83 are selected merely by turning the tuning knob in a continuous swing across the dial face.

No changeover switching or other mechanical or electrical operation is required of the user except the simple tuning of a single dial for all channel selections. Similarly, a single vernier control affects the fine tuning for any selected channel throughout the 83 VHF and UHF channels.

The simplified arrangements and features of the invention tuner affect cost and size savings as compared to the prior art. Its effectiveness both from the consumer's use standpoint and from the resultant electrical operation are superior as compared to prior combination tuners.

More specific advantages of the invention tuner, as will be set forth hereinafter, involve simplification of the all-channel tuning wafer construction utilizing simplified stampings for channels 2 to 83, including a UHF transmission line. Channels 2 to 6 are formed by printed circuitry.

The novel composite VHF–UHF 360° wafers of the present invention permit a compact, effective, structure for the tuner at minimum cost in parts and assembly time. The invention composite wafers and tuner construction lends itself to the advantages of automatic production assembly, soldering, etc. as will be set forth.

It is accordingly an object of the present invention to provide a novel composite VHF–UHF television tuner of relatively small size and inexpensive construction.

Another object of the present invention is to provide a novel composite television tuner operable over all the UHF and VHF channels with single electrical circuitry, avoiding cross-over switching.

A further object of the present invention is to provide an all-channel television tuner with high quality performance and with low noise in UHF signal reception and high gain at UHF.

Still another object of the present invention is to provide a novel UHF–VHF television tuner having tuning wafers containing provision for all 83 channels within a single 360° rotation of a common tuning knob.

Still another object of the present invention is to provide a novel UHF–VHF television tuner having a common oscillator circuit and common vernier fine tuning.

Still a further object of the present invention is to provide a novel UHF–VHF tuner incorporating 12 indexed positions for VHF channel selection and a continuous UHF tuning line, all arranged on a single 360° basis.

Still another object of the present invention is to provide a novel UHF–VHF television tuner incorporating novel tuning wafers, with VHF and continuous UHF elements operated in successive sectors.

These and further objects of the present invention will become more apparent in the following description of an exemplary embodiment thereof, taken in connection with the drawings in which FIGURE 1 is a side elevational view of a section of an exemplary tuner with the shielding removed.

Figures 5, 5A, 5B:
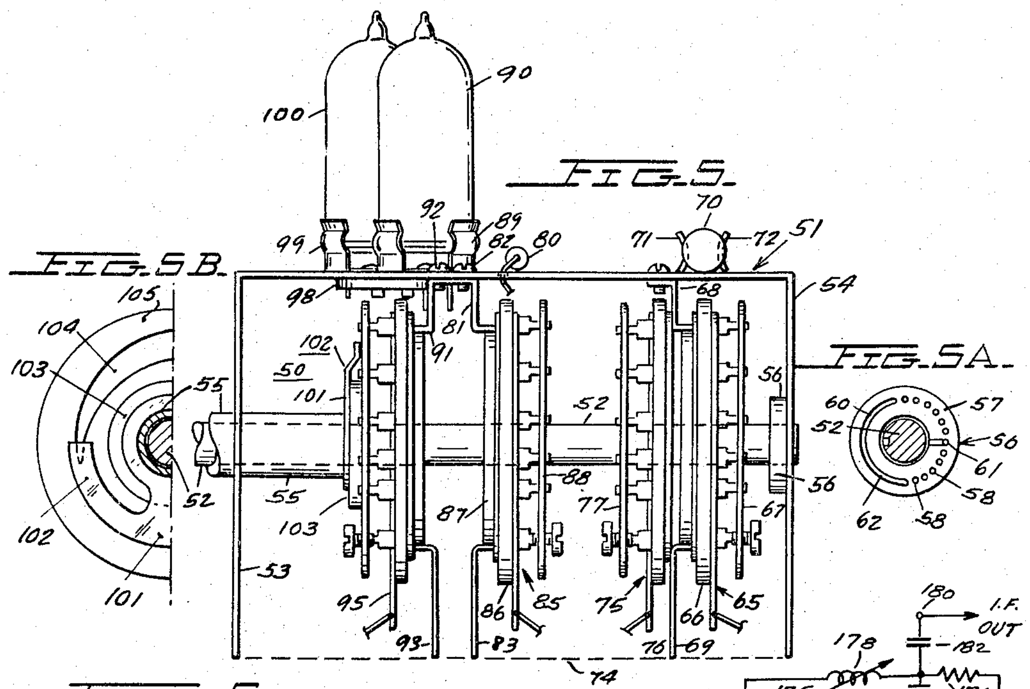
FIGURE 5 is an end elevational view of an exemplary tuner assembly in accordance with the present invention with the shield removed.

FIGURE 5*a* is a diagrammatic view of the interior of an exemplary detent used in conjunction with the tuner of FIGURE 5.

FIGURE 5*b* shows the grounded plate operable in conjunction with the vernier tuning shaft of FIGURE 5.

Figure 6:
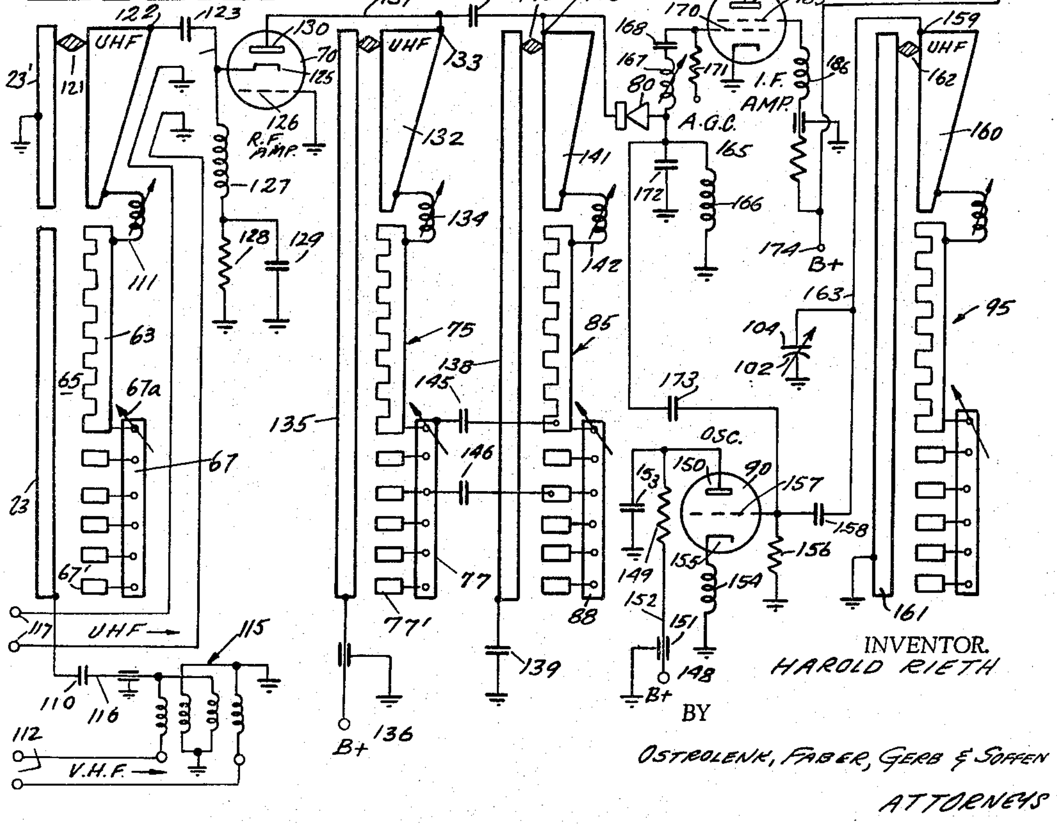

FIGURE 6 is a schematic electrical diagram of the invention all-channel television tuner.

Figure 1:
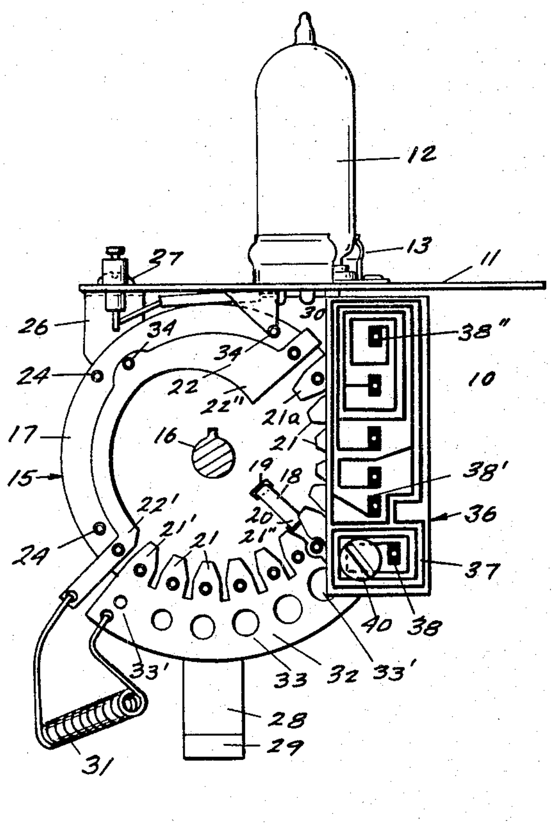
Figure 2:
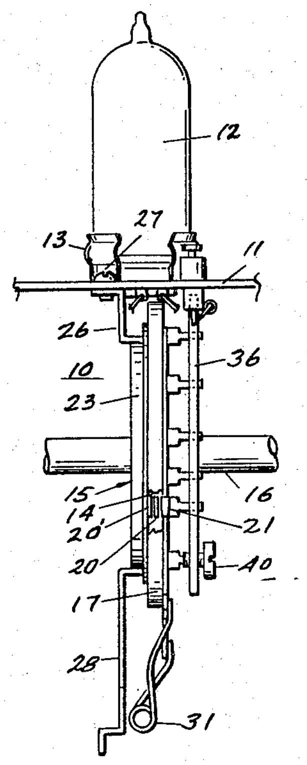
FIGURE 2 is an end elevational view of the tuner section of FIGURE 1.

FIGURES 1 and 2 are respective side and end elevational views of a section of an exemplary tuner. The tuner 10 comprises a metallic chassis base 11 upon which are mounted electron tubes including vacuum tube 12 held in socket 13 secured to chassis 11. The all-channel wafer 15 is dependently supported below chassis 11. The invention tuner 10 employs four all-channel wafer inductances corresponding to 15 for the various circuit functions, as will be more fully described in connection with the tuner of FIGURES 5 and 6. The novel aspects of the all wafer inductors 15 are herein described in connection with FIGURES 1 to 4 and are similar to the tunable all-channel selector sections of the full tuner 50 to be described.

The all-channel inductor 15 comprises a rotor 14 having a central opening to which a control shaft 16 passes and is keyed or is otherwise suitably secured. The rotor 14 is of dielectric insulation material in the form of a circular disc rotatable within fixed stator 17. A contactor 18 is mounted in rotor 14 across an opening 19 therein. The radial tip 20 of contractor 18 is arranged to engage the inward projecting tips 21 of the VHF radially disposed inductance connections, and the underside of the UHF tuning transmission line 22.

The contactor 18 secured in rotor 14 extends on both sides thereof as seen in FIGURE 2 at the broken away section. The tip 20 of contactor 18 connects the VHF tips 21 and the underside of the UHF line 22 through contactor 18 to tip 20′ that is continuously in contact with ground ring 23. The ground ring 23 is riveted to the insulation stator 17 through rivets 24, 24 and tabs 25, 25 integral with the ground ring.

A support bracket 26 extends from the top portion of ground ring 23 and is secured to the underside of chassis 11 by bolt 27. A further bracket 28 extends from the bottom portion of ground ring 23 and contains a projection 29 for insertion in a chassis section of the tuner 10 (not shown) for maintaining the wafer vertically and fixed.

The general arrangement of circular rotor 14 and contactor 18 within stator 17, and the coaction of contactor points 20, 20′ with the stationary connections to the inductances, are generally similar to the construction of the wafer shown and described in U.S. Patent No. 2,870,274 issued Jan. 20, 1959, assigned to the same assignee as is the present case.

Figure 3:
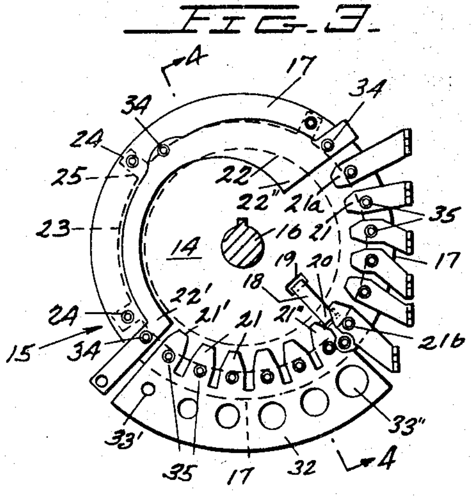
FIGURE 3 is a side view of the composite UHF–VHF tuning wafer with the printed section removed.

Essentially the present invention affords a compact novel all-channel wafer inductor discretely for the 12 VHF channels, and continuously for the 70 UHF channels. The all-channel wafer 15 is constructed for minimum cost and space, and for maximum effectiveness. As seen in FIGURES 1 and 3, the VHF 12-channel section comprising the inwardly extending radial contacts 21, 21 extends for over 180° about the stator 17. The UHF tunable transmission line 22 extends over the remaining 180° of wafer 15. Thus, a 360° rotation of rotor 14 through control shaft 16 executes the tuning for all 83 assigned television channels in succession.

An important feature of the invention wafer 15 and its inclusion circuitwise, as will be hereinafter set forth, is the tapered UHF transmission line 22 arranged on a predetermined sector of wafer 15. The transmission line 22 is tapered from the narrow portion 22′ (corresponding to channel 14) adjacent contact 21′ for VHF channel 13. Continuous connections along the transmission line 22 is made until its terminal section 22″ corresponding to channel 83. Such continuous connection is afforded through the rotation of rotor 14, with the connection tip 20 of contactor 18 connecting to the continuous transmission line 22 when positioned thereat.

It is important to note that the shape of transmission line 22 for the UHF channels 14 to 83 is designed to effect a continuous incremental inductance addition or change in the circuit between the channel 14 position 22′ and the highest channel position 83 at 22″. The shape of transmission line 22 is determined mathematically or empirically, as desired. The shape is also determined to effect given dial readings of the UHF channels as desired. In other words, a linear disposition of dial readings for 14 to 83 for the channels results in the general shape of the transmission line 22 as shown in the drawings. Should a different dial configuration be desired, corresponding alteration in the transmission line 22 shape is required, as will be understood by those skilled in the art.

The wafer 15 as illustrated in FIGURES 1, 2 and 3 effects continuous selections of channels 14 to 83 in the UHF section of wafer 15 through the continuous contacting of the transmission 22 with the grounded ring 23. It is to be understood by reference to FIGURE 6 and as will be disclosed in more detail hereinafter that by connection of lug 30, extending from the terminal high frequency end 22″ of transmission line 22 direct to the tube (12) circuitry, a minimum amount of inductance is in circuit when the contactor 18 is opposite the 22″ section of transmission line 22. The remainder of the transmission line 22 and the series connected inductances corresponding to the VHF section are thereupon unconnected circuitally, and therefore do not directly affect the frequency tuned in at the 22″ position.

The inductance subtended by contactor 18 at the 22″ end of transmission line 22 has the least subtended inductance of wafer 15 in circuit with the tuner, and accordingly provides the highest frequency, namely channel 83 (890 mc.). As contactor 18 is rotated counterclockwise in FIGURES 1 and 3, more and more of transmission line 22 is included in the circuit to the tuner, thereby decreasing the frequency tuned, and the channel number is lower in correspondence therewith. When contactor 18 is at the section 22′ of the transmission line 22, the full transmission line is in circuit corresponding to channel 14 or 470 megacycles.

A discontinuous frequency jump occurs between channel 14 position 22′ and channel 13 position 21′ at 216 megacycles. To bridge this gap circuitally, a suitable inductance 31 is connected therebetween, as shown in FIGURE 1. The transfer impedance 31 effects a smooth transition so that when contact end 20 of contactor 18 moves from position 22′ to position 21′, the proper frequencies, namely 470 and 216 megacycles, occur respectively. As is usual in inductance wafers used as frequency selectors, the associated capacity for the selected inductance to provide the desired frequency is fixed in the tuner circuitry with only the inductance varied.

Between channels 13 and 7 corresponding to the respective contact lugs 21′ and 21″, a continuous stamping 32 is used with a succession of holes 33 stamped therein of increasing diameter between channels 13 and 7. The opening 33′ opposite channel 13 at the 21′ position is the smallest; while opening 33″ opposite channel 7 at position 21″ is the largest. The purpose of the openings 33 is to vary the inductance along arcuate stamping 32 to afford the predetermined selected frequencies as contactor 18 connects with the successive inwardly extending contacts 21, 21, similar to that described in the aforesaid Patent No.

2,870,274. It is of course understood that for the purposes of the present invention, individual inductance coils may be connected between radial lugs 21 without departing from the broad idea of the invention all-channel wafer 15.

It has been found that the stamped section 32 for channels 7 to 13, together with the stamped continuous UHF transmission line 22, effects a material cost reduction in fabrication of the wafers. In fact, the stamping 32 corresponding to the high frequency end of the VHF band channels 7 to 13, is stamped integrally with the UHF line 22 and mounted on the stator 17, then separated by cutting.

Similarly, the connection lugs 21*a* to 21*b* corresponding to channels 2 to 6 have inwardly radial lugs similar to those of 21′ to 21″. Such lugs may also be part of the integral stamping including transmission line 22 and VHF line 32, duly separated after anchoring or riveting to stator 17.

The UHF transmission line 22 is secured to the insulation stator by a plurality of rivets 34, 34; while each of the VHF radial connection lugs 21, 21 are riveted to the stator by suitable rivets 35, 35. The accurate positioning and placement of the various connection lugs 21, 21 on the stator 17 is predetermined by the riveting, and so maintained after the die-cutting for separation of the respective lugs 21. VHF section 32 and UHF section 22 are in a form which may be mounted in a unitary operation.

It is thus seen that the 12 discrete connections for the VHF together with the high frequency end of the VHF band 32 and UHF line 22 may all be stamped from a single unitary metallic sheet, then suitably affixed through rivets 34, 35 to stator ring 17, and cut to final connection arrangement to provide a single, simply made, all-channel wafer.

The inductance for the lower channels 2 to 6 of the VHF band are provided by printed circuit board 36. As seen in FIGURE 1, circuit board 36 contains a printed coil array comprising section 37 corresponding to channel 6–7 connection through terminal 38; and successively through terminals 38′ to 38″ to constitute a total inductance corresponding to the channel 2 connection to contact lug 21*a*. The inductance printed on board 36 is cumulative between terminals 38 to 38′ with successive terminal points to the successive radial connectors 21*a* to 21*b* for channels 2 to 6 on stator 17.

The printed board 36 provides suitable inductance values for channels 2 to 6 and may be replaced by individual coils between the radial connections 21, 21 for these channels. However, it has been found that the use of the single coil board 36 for these frequencies can be predetermined for mass production with minimum cost.

At the channel 6–7 position 37, a flat-headed brass screw 40 is mounted for varying the effective inductance thereat, and serving as a transfer inductance between channels 6 and 7 which have a substantial frequency gap. In other words, the terminal 38 of circuit board 36 constitutes the beginning of the continuous inductance along board 36 connected to the channel 7 radial contact 21″ with the coil 37 varied in inductance value by brass-headed screw 40 serving as the transfer inductance to effect channel 6 frequency when the contactor 18 is at the connection point 21*b*.

Similarly the remaining five terminals 38′ to 38″ are connected successively from channels 2 to channel 6. More detailed electrical interconnection of the inductance board 36, transfer coil 37, and the channel contacts are set forth in the schematic electrical tuner circuit to be described more fully hereinafter.

At this point it is important to note that a simple unitary all-channel wafer 15 is feasible and practical with the invention arrangement of the 12 successive and discretely selected inductances for VHF channels 2 to 13, with the continuous execution of UHF tuning from channels 14 to 83 across the adjacent 180° rotation by rotor 14. A single contactor 18 is employed for all 83 channels, and the consumer who rotates the control shaft 16 simply goes from the 12 positions along 180° for the VHF channels and preferably in a linear fashion selects channels 14 to 83 along the remainder of the 360° rotation.

It is to be understood that within the spirit and scope of the present invention the arrangement of the VHF and UHF sections may be different than the 180° exemplary form. In other words, it may be desirable to employ the principles of the present invention with the 12 discrete VHF positions subtending 120°, or even 90°, with the remainder of the 360° rotation of rotor 14 utilized for angularly spreading out the UHF band 14 to 83. Significantly, however, the invention provides a 360° rotation of the rotor 14 and therefore of control shaft 16.

Continuous selection is effected of all the assigned channels 2 to 83. The selective all-channel wafers 15 are small and compact and effective for this purpose, without mutual interference between the UHF and VHF sections. No changeover switching or special isolation is required.

The UHF and VHF sections in the invention arrangement have only the inductance of the wafers 15 in circuit for the desired frequency, with the inductances for all the channels below the tuned-in frequency effectively out of circuit and therefore out of interference possibilities.

FIGURES 1 to 4 illustrate the compactness and relative narrowness of wafer 15. The rotor 14 rotates within the circular pocket formed concentrically within stator 17 by projecting connections 21 of the VHF section and the projecting transmission line 22 of the UHF section. Since rotor 14 in the exemplary embodiment is a circular disc, it is held stably for rotation within circular rotor 17, and its contactor 18 effects firm connection across the VHF contacts 21 and the UHF transmission line 22, the VHF in discrete steps and the UHF in a continuous fashion.

A detent for indexing the VHF selections is employed with the shaft 16 for all the 12 VHF positions. However, when the UHF position across transmission line 22 is reached, no indexing or detenting is used in order that continuous selection of channels 14 to 83 is effected.

The control shaft 16 may be rotated whereby contactor 18 will move from the channel 83 position at 22″ directly to the channel 2 position at 21*a*. This is an important practical aspect of the invention tuner, as it is not necessary to retrace the normal turning of the counterclockwise rotation starting at the lower channels and up through the high. In other words, tuning or frequency selection with the invention tuner is as simple as present day selection of stations in radio broadcasting in the AM or FM bands.

Figure 4:
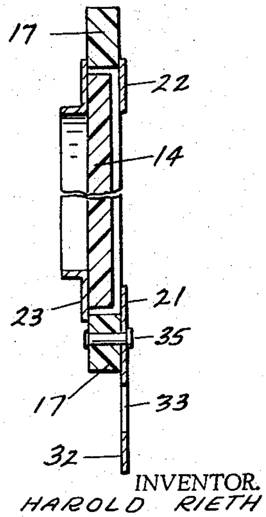
FIGURE 4 is an enlarged cross-sectional view through the wafer of FIGURE 3, taken below the line 4—4 thereof.

The rotor 14 as seen in FIGURE 4 is enclosed or permanently encased for rotation within stator 17 through ground ring 23 riveted on one side thereof, and the transmission line 22 with VHF connections 21 on the other side thereof. Contactor 18, shown in FIGURES 1 and 3, accordingly ride in a predetermined path to effect the successive connections of all VHF contacts 21 and of the UHF transmission line 22, and effects continuous selection of channels 2 to 83 as will now be understood.

The contactor 18 makes connection between the VHF projections 21, 21 and the UHF transmission line 22 to the common ground ring 23. Where necessary or desirable the ground ring 23 may be split into two or more sections, as will be set forth in connection with the description of the overall tuner circuit in FIGURE 6.

The general construction and arrangement of the unitary all-channel wafers 15 of the invention for use in an all-channel tuner is adaptable for the various circuit sections of the tuner, namely, the RF amplifier section, the mixer section, and the oscillator section. Wafers corresponding to 15 are constructed with 12 indexed VHF sections and the single continuous UHF section effective over 360° continuous rotation of a common tuning dial.

FIGURE 5 is an end elevational view of an all-channel tuner embodying four all-channel wafers corresponding to wafer 15 in FIGURES 1 to 4.

FIGURE 6 is a circuit diagram of the exemplary all-channel tuner embodying such all-channel wafers, and corresponds to the physical embodiment shown in FIGURE 5.

The mechanical all-channel tuner showing of FIGURE 5 is simplified in that circuit components such as resistors, coils and condensers interconnecting the wafers and the tubes are not indicated. The all-channel tuner 50 comprises a metallic frame 51 of box-like construction which shields tuner 50 and serves as a support for the tuner components and control shaft 52.

The tuner control shaft 52 extends through an aperture in the front face 53 of chassis 51 and terminates rotatably in rear face 54 of chassis 51. A vernier tuning shaft 55 is mounted concentrically about the forward portion of control shaft 52 and extends forwardly therewith (to the left) to knobs (not shown).

The tuning shafts 52 and 55 are suitably mounted in frame 51 in the manner understood by those skilled in the art. Control shaft 55 extends to detent unit 56 shown at the rear face 54 of the chassis frame 51. The detent unit 56 is indicated in a general manner as specific details thereof form no part of the invention. The detent 56 is arranged to suitably index the shaft and the rotors of the all-channel wafers of the tuner 50 for the 12 VHF channel positions of the wafers along the lines disclosed hereinabove in connection with all-channel wafer 15.

The remaining UHF sweep, namely 180° in exemplary wafers, is not indexed or otherwise detented and permits the shaft 52 to rotate in a continuous manner in order that the rotors of the wafers within tuner 50, corresponding to rotor 14 and contactor 18 of the wafers 15, effectively coact with the UHF transmission lines of the wafers of the all-channel tuner. This action operates the tuner 50 in the UHF region of channels 14 to 83.

FIGURE 5A is a diagrammative view of the interior of a suitable detent 56. The shaft 52 passes through the central portions of detent 56. The race 57 of the detent has 12 equally spaced depressions of small cavities 58, 58 subtending approximately 180° of the detent race 57. Each cavity 58 corresponds to the proper indexed position of the control shaft 52 for the rotor posiions in the wafers for the 12 VHF channel inductance selections. A ring 60 is secured to shaft 52 and contains an arm 61, the end of which coacts with the cavities 58, 58. A spring-pressed steel ball extends from arm 61 into cavities 58, 58 for the indexing as shaft 52 carries arm 61 with respect thereto.

The UHF channel selection is over the continuous UHF transmission lines in the tuning wafers. Towards this end an arcuate approximately 180° slot 62 is impressed along detent race 57 carrying the detent ball at arm 61 in a continuous fashion. The detent race 57 is secured against rotation to the chassis back 54. The detent 56 shown in FIGURE 5A is for illustrative purposes to demonstrate indexing for the VHF and continuity for the UHF channel selections over the 360° sweep of control shaft 52.

It will be further noted that the control shaft 52 may repeat in its rotation without having to be reversed for restarting. This permits ease in selection by the consumer in rotation of the control knob for the tuning in either clockwise or counterclockwise rotation for ready selection of the desired channel.

The exemplary all-channel tuner 50 comprises four all-channel wafers 65, 75, 85 and 95. The all-channel wafer 65 is at the input end of the tuner and is utilized for the RF amplifier input of the tuner, coupling the antenna input circuitry to the RF amplifier tube input, as will be more further detailed in connection with the circuitry of FIGURE 6. The RF amplifier tube utilized is indicated at 70 and is capable of providing gain throughout the complete UHF–VHF frequency spectrum. The exemplary tube 70 is the 6BY4 type which is clipped into circuit by contactors 71, 72 and mechanically maintained on the tuner chassis therewith.

Circuit connection of the high frequency amplifier 70 to the remainder of the tuner circuit, including input RF wafer 65 and output RF wafer 75, are detailed in FIGURE 6. Wafers 65 and 75 are similar in construction to the 360° all-channel wafer 15 described hereinabove and contain respective stators 66 and 76 and printed lower VHF band channel inductance boards 67 and 77 respectively.

It is to be understood that the incremental inductances and continuous UHF transmission lines for tuning these wafers to the channel frequencies upon rotation of the common tuning shaft 52 is similar to that set forth for the basic all-channel wafer 15 hereinabove. The common support brackets 68 and 69 of wafer 65 is utilized to support wafer 75 in the tuner in view of their back to back juncture indicated. Other suitable mounting arrangements may of course be employed. The top bracket 68 is secured to chassis 51 by bolt 73. The bottom bracket 69 is inserted in a slot in the bottom chassis cover indicated by the dotted line 74.

The all-channel inductor wafer 85 is utilized in the exemplary embodiment as the secondary "winding" coupled to the primary RF output inductor 75. Wafer 85 is supported in the tuner 50 by top bracket 81 secured to chassis 51 by bolt 82 and by the bottom bracket 83 supported in the base 74. Wafer 85 has a stator 86 and ground ring 87. The lower VHF band inductance panel 88 is also seen in FIGURE 5 for inductor 85. The secondary inductor 85 is effectively the mixer-input inductance unit for the tuner as it is connected to the mixer crystal 80 shown in FIGURE 6.

The all-channel inductor 95 is the oscillator wafer, which through mutual coupling or other suitable interconnection, injects the oscillator voltage to wafer 85 in the usual practice. The oscillator wafer 95 is supported in the tuner 50 by bracket 91 secured by bolt 92 to chassis 51 and by a lower supporting bracket 93 anchored in the frame indicated at 74. A triode vacuum tube 90 is employed as the all-channel oscillator tube capable of producing the necessary oscillator frequencies for converting the whole television range (for the channel 2 frequency of 54 megacycles to the channel 83 frequency of 890 megacycles) to the intermediate frequency which in the exemplary embodiment is 41 megacycles. A type 6AF4 tube has been found satisfactory for this purpose.

The inductor sections for the VHF and UHF portions of the oscillator wafer 95, taken in conjunction with the remainder of the oscillator circuit, is constructed different than that of the basic channel frequency inductances 65, 75, 85 in order to provide a differential frequency for the oscillator for the heterodyning to the intermediate frequency output, as will be understood by those skilled in the art. The oscillator tube 90 is mounted in a suitable socket secured to the chassis frame 51 having a metallic rim 89 to which a tube shield (not shown) is secured to surmount tube 90 and minimize radiation.

In the exemplary tuner 50 an additional vacuum tube 100 is employed in the circuit as the intermediate frequency or IF amplifier stage. The IF amplifier 100 is suitably mounted on the chassis 51 through a tube socket 98 with a metal ring 99 for the tube shield. The use of a separate IF amplifier tube in the exemplary tuner 50 produces enhanced amplification and substantial level of signal output of the tuner to the IF amplifier of the television receiver. In this manner high signal-to-noise ratio signals for all the channels 2 to 83 are afforded through the tuner 50 of the invention.

It is of course understood that the IF amplifier tube 100 may be employed external on tuner 50 in the receiver circuit if desired, and the overall gain requisite for the television receiver may be provided at the receiver itself.

An important feature of the present invention is the utilization of a single oscillator tube to operate both the VHF and UHF channels in a simplified tuner system. Not only is the common tuning control shaft 52 used for all the television channels 2 to 83, but also a single vernier or fine tuning arrangement common thereto. The vernier tuning shaft 55 has secured thereto a ground plate or sector 101 with a metallic extending arm 102 as seen in FIGURES 5 and 5B. The grounded arm 101 is secured to a collar 103 suitably fastened to sleeve shaft 55, and in turn grounded through chassis frame 51 to which it is contiguous. Coacting with the grounded tuning arm 101, and particularly its extended top portion 102, is a fixed or stator condenser plate 104 mounted in a dielectric support 105 as seen in FIGURE 5B.

The vernier condenser 102, 104 may extend over a substantial sweep of rotation of the vernier shaft 55 and is schematically indicated as vernier condenser 102, 104 in FIGURE 6 connected in the oscillator circuit. The common vernier condenser 102, 104 may take other forms without departing from the scope of this invention and its utilization for all the television channels. A significant factor here is the use of a single vernier for channels 2 to 83 operating continuously over a 360° rotatable sweep through the common vernier shaft 55. Each of the condenser arms 102 and 104 extends only about 180° of arc in order that they may coact into full-in and full-out relationship as an ordinary condenser action. Their spacing is determined by their area and requisite capacitance needed by condenser 102, 104 for the full sweep.

FIGURE 6 of the exemplary tuner illustrates the utilization of the all-channel wafers 65, 75, 85 and 95 in a simplified circuit for the all-channel tuner operative in 12 discrete steps for VHF channel selection, and continuously for the UHF channel selection as heretofore referred to. The RF input wafer 65 has a split ground collector, namely into sections 23 and 23'. The UHF section ground ring 23' is signal grounded while the VHF ground ring section 23 has the VHF antenna input impressed thereto through coupling condenser 110.

The wafer inductance sections of unit 65 are indicated schematically with the lower VHF band positions provided by the printed circuit board 67; the upper VHF channels by the stamped section 63; and the continuous UHF transmission tuning line by section 64.

The transfer inductance between channels 6 and 7 is indicated at **67*a*. The transfer inductance between channels 13 and 14 is indicated at 111. The VHF antenna input is at terminals 112 of the tuner connecting directly to the antenna transformer 115. The output lead 116 of transformer 115 connects to antenna input condenser 110 of the circuit. The UHF antenna is connected to the UHF antenna input terminals 117 which through leads 118 connect to UHF coupling links 120. Links 120 couple the UHF antenna input signals to the UHF transmission line 64. The contactor for all-channel wafer 65 is indicated at 121**.

Rotation of the control knob of the tuner motivates contactor 121 across the successive sections 64, 63 and 67 of the tuner to effect the desired channel selection. It is noted that contactor 121 connects progressively more and more inductance from its indicated position at the top of the UHF line (corresponding to a high UHF channel) and on downwardly until more and more inductance is added to the antenna input circuit corresponding to lower channel frequencies as will now be understood by those skilled in the art. The lowest position 67' of wafer 65 corresponds to channel 2 at 54 megacycles. The output end of the UHF line 64 is connected at 122 to the input of triode amplifier 70 across coupling condenser 123 and lead 124 to the cathode input 125.

The RF amplifier tube 70 is connected in the exemplary embodiment as a signal grounded grid 126. Coil 127 is a radio frequency choke coil. The resistor 128 is a self-biasing resistor for the cathode circuit 125 of the tube 70. In the exemplary embodiment using a 6BY4 tube, the cathode resistor 128 was 200 ohms. A by-pass condenser 129, such as 1000 mmfd., is connected across resistor 128. The output of RF triode 70 is effected through plate electrode 130 to output lead 131. In the described exemplary radio frequency amplification circuit, gain is effected throughout the complete UHF–VHF frequency spectrum, providing RF amplification throughout preceding the crystal 80 mixer circuit. This amplification at the UHF frequencies results in a substantial reduction in the noise figure, providing a good signal-to-noise ratio for the tuner which is important in comparison with prior art tuners at the higher UHF channels.

The plate output circuit of triode 70 comprises all-channel tuning wafer 75 extending from the lowest VHF channel 2 at 77' on up through the start of UHF transmission line 132. The terminal 133 of UHF line 132 is connected directly to the plate electrode of tube 70 through lead 131. Channel 13 to 14 transfer inductance is indicated in the circuit at 134. The collector ring 135 is used in wafer 75 as the B+ supply to the plate 130 to the terminal 136. Movement of wafer collector 137 along the ring 135 connects the B+ supply from ring 135 to plate 130 through the particular connected channel position discretely along the 12 VHF channels and continuously along the UHF line 132.

The secondary "winding" or mixer stage wafer 85 is similar to output wafer 75. The signal grounded collector ring 138 of wafer 85 is connected to ground through condenser 139. The contactor 140 is used to select inductance for the requisite frequency along all-channel selector 85 including its UHF long line 141. The transfer inductance 142 connects the channel 13 of the VHF with the lower end of channel 14 of the UHF sectors. The top end or terminal 143 of UHF section 141 is connected directly to the crystal mixer diode 80. A small capacitance 144 interconnects the plate circuit 130 to mixer circuit 80 to assist in the mutual coupling between wafers 75 and 85. Also, to balance out the mutual coupling at the lower VHF frequencies, small condensers 145, 146 are utilized as indicated in FIGURE 6.

The common oscillator triode 90 is selected to efficiently produce the requisite signals for injection into mixer circuit 80 through wafer 85 throughout the VHF and UHF bands (54 to 890 megacycles). To effect the exemplary 41 megacycle intermediate frequency output, the frequency range of oscillator 90 is from 95 to 931 megacycles. The 6AF4 oscillator triode has been found adequate for this purpose. If desired, however, the oscillator frequency difference may be lowered in the corresponding UHF frequencies. In the latter event the top frequency for oscillator 90 output would be 849 megacycles instead of 931 megacycles.

The B+ supply of terminal 148 connects directly to the plate 150 of oscillator 90 through dropping resistor 149, which in the exemplary embodiment is 1000 ohms. A feed-through condenser 151 is used in lead 152 for the B+ connection, which in the embodiment herein is 1000 mmfd. The by-pass condenser 153 of 1000 mmfd. shunts dropping resistor 149 to ground. An RF choke 154 connects the cathode 155 of oscillator 90 to ground. A biasing resistor 156 connects grid electrode 157 to ground, which in the exemplary embodiment is 10,000 ohms. The oscillator all-channel wafer 95 is coupled to grid electrode 157 through coupling condenser 158 of low capacitance, such as 3 mmfds.

The top terminal 159 of the UHF transmission line section 160 of oscillator wafer 95 is connected directly to grid electrode 157 of the oscillator. The ground ring 161 of wafer 95 is grounded. The contactor 162 thereupon successively connects the UHF and VHF segments of oscillator all-channel wafer 95 in circuit between grid 157 and ground, establishing the frequency of oscillator 90. Shunted across wafer inductance unit 95 is vernier condenser 102, 104 connecting the wafer 95 at lead 163 to ground. The rotation of rotor plate 102 of the vernier condenser correspondingly adjusts the frequency determination of the oscillator wafer 95 to effect the desired fine tuning.

The input to mixer 80 contains the heterodyned signals of the UHF–VHF amplifier of the selected channel and the oscillator frequency matched thereto to provide the 41 megacycle output at the terminal 165. A radio frequency choke 166 is connected between terminal 165 and ground. The 41 megacycle output of mixer 80 is tuned by adjustable coil 167 and series condenser 168 to the exemplary 41 megacycles, and impressed upon control grid 170 of IF amplifier tube 100.

Also the automatic gain control AGC bias signal is impressed upon grid 170 through resistance 171 in series with the grid. The exemplary unit resistor 171 is 4700 ohms. The by-pass condenser 172 to ground is connected to the mixer output terminal 165 which is of a size that permits the passage of 41 megacycle signals to the tube circuit 167, 168 and by-passing the higher frequencies corresponding to the input television signals and oscillator signals. A capacitance of 30 mmfds. is ample for this purpose.

A condenser 173 of small magnitude, such as 1.5 mmfd., is shown connected between the oscillator grid electrode 157 and the output terminal 165 of mixer 80. The exemplary tuner circuit is completed by the output IF amplifier stage 100. The B+ supply to stage 100 is effective through the B+ terminal 174 connecting to plate 175 of stage 100 through dropping resistor 176 shunted by filter condenser 177, and the series coil 178 tuned to the 41 megacycle IF output frequency. The IF output terminal 180 connects to the output point 181 of series coil 178 through coupling condenser 182. The IF amplifier tube is shown as a tetrode having a screen grid electrode 183 energized from the B+ supply terminal 174 through dropping resistance 185, choke 186 and feed-through condenser 187 connected to ground. A type 6CB6 tube is used for IF amplifier 100 in the exemplary tuner.

The use of the single oscillator tube 90 for both the UHF and VHF makes it possible to use a fine tuning mechanism including condenser 102, 104 as common for both the UHF and VHF. Thus the savings of a second fine tuner mechanism is made in the present tuner with the corresponding simplification of a single dial control for vernier tuning through shaft 55. The exemplary tuner provides a truly single packaged tuner without shields or sections that otherwise restrict circuitry, and components between the UHF and VHF tuning positions. The simplified tuner is of the same order of size as the comparable VHF tuner or the VHF performance. There is a minimum of wiring, components, and drive mechanisms. It is employed in a single position in the television receiver having its output directly to the IF frequency section, and its input other than the B+ supplies and the AGC connection comprising the VHF and UHF antenna connections.

The novel all-channel wafers 65, 75, 85, 95 and the simplification of the tuner circuitry with the composite UHF and VTF selection by such wafers permits a low cost combination UHF and VHF tuner requiring a minimum of labor for assembly. All the VHF contacts, the seven high VHF channel coils, and the UHF tuning lines for each of the all-channel wafers are stamped in one operation in the exemplary embodiment. All of these parts which could amount to as high as 32 parts if built in a conventional manner, are held together with small connecting webs in a manner of the aforesaid patent application. These are later clipped-out in one operation after the stamped assembly is mounted to the switch stator by staking-over of lances formed in the sections, or by rivets as desired.

The contact ring is so formed as to receive a printed circuit board which has all the low VHF channel coils, and the channel 6 to 7 transfer coil set by an adjusting screw as hereinabove described. Also the ground ring of each of the all-channel wafers is used as a common leg. Such an all-channel wafer construction can save as high as 75% time in its alignment operations.

The exemplary tuner construction comprises a flat metal plate chassis frame (51) in which the wafers are mounted and are laid out as shown in FIGURE 5 in such manner that all the components are mountable by their own leads, thereby eliminating the need for wiring as the term is usually used.

All components are spaced and oriented in such a manner as to be capable of being automatically mounted to the chassis by suitable machinery. All components such as coils, resistors, etc., are positioned so that when a chassis plate (51) is dipped into a solder bath, the connections are all soldered without damage to the components. The components of the tuner are positioned against the chassis while the soldered joints are arranged at least ⅜" below the chassis surface. Such an arrangement can save approximately 66% in assembly and wiring time.

Using the RF tube 70 on the UHF frequency spectrum, a major reduction in the oscillator radiation of the UHF is effected, which in previous tuners caused a major problem. Such reduction is primarily due to the fact that the plate to cathode capacity in the RF tube 70 described is of the order of .007 mmfd. and offers maximum isolation between the oscillator circuit and the antenna. The output of the exemplary tuner to the IF amplifier tube 100 is a high signal-to-noise ratio and provides ample clear usable signals for all the transmitted television channels, including the high channel 83. It has been found that the overall cost of a tuner constructed in accordance with the present invention is less than any prior composite tuner for the reception of all the channels 2 to 83.

Although I have described an exemplary embodiment of the present invention, it is to be understood that variations thereof are feasible without departing from its broader spirit and scope as defined in the appended claims.

I claim:

1. An all channel television tuner for the UHF and VHF broadcast bands, comprising common RF amplifier, oscillator and mixer stages mounted to a chassis support, said chassis being at circuit ground, grounding means electrically connecting portions of each of said stages to chassis ground, each of said stages including an electron control device and a continuously tuned variable inductance element for selective frequency tuning of its respective stage, each of said tuned variable inductance elements consisting of a single insulative wafer having opposed first and second planar surfaces, UHF and VHF inductance sections contiguously mounted on said first planar surface, about a circular arc, said UHF section being a single continuous transmission line limited in its operation to the UHF band and forming a first portion of said circular arc between first and second ends thereof, said first end of said UHF transmission line circuit connected to a selected terminal of its associated electron control device, and said UHF transmission line presenting progressively increasing inductance towards its second end, said VHF section including a series of discrete terminal connectors adjacently arranged about the remaining second portion of said circular arc, a first of said series of VHF terminal connectors located closely adjacent said second end of the UHF transmission line for continuing the circular arc between said VHF and UHF sections, the last of said series of VHF terminal connectors completing the circular arc, means providing progressively increasing inductance to said series of VHF terminal connectors between said first and last terminal connectors, a grounding member mounted to said second planar wafer surface, said grounding means electrically connecting said wafer grounding member to chassis ground, with said UHF and VHF inductance sections electrically insulated therefrom, a movable contact terminal rotatively carried by the central portion of said wafer for movement about said circular arc, said movable contact terminal circuit connected to said wafer grounding member, the movement of said movable contact terminal in a first direction about said circular arc progressively moving the ground provided by said contact terminal along said arc for connecting increasing inductance portions of said UHF and VHF sections between the selected terminal of said electron control device and chassis ground, such that the continuous arcuate movement of said movable contact terminal provides frequency tuning over the UHF and VHF bands.

2. In an all channel television tuner as set forth in claim 1, said wafer including an annular stator portion and a central rotor portion, said UHF and VHF inductance sections mounted to said stator portion, and including contact engaging portions projecting inward towards said rotor portion, said wafer grounding member being annular in shape and including a first section mounted to the second planar surface of said stator and a second section projecting inwards towards said rotor portion, said rotor portion sandwiched between the inwardly projecting regions of said contact engaging portion and grounding member second section, said movable contact terminal being a U-shaped element carried by said rotor portion, one arm of the U contacting said grounding member section, the body of the U extending through said rotor portion, and the other arm of the U contacting the contact engaging portion selected inductance section.

3. In an all channel television tuner as set forth in claim 1, said UHF transmission line and at least some of said VHF terminal connectors formed of a single planar stamping.

4. In an all channel television tuner as set forth in claim 3, at least a portion of the progressively increasing VHF inductance also provided by said single planar stamping.

5. In an all channel television tuner as set forth in claim 1, said UHF and VHF sections additively subtending 360°, said movable contact element movable in a second direction, opposite said first direction, between said first end of the UHF transmission line and said last VHF terminal connector, whereby said tuner may be directly tuned between the highest UHF channel and lowest VHF channel without sweeping 360°.

6. An all channel television tuning wafer as defined by claim 1, in which said UHF transmission line has a configuration of increasing width towards said first end to equalize the UHF tuning dial channel settings, and further comprising a transfer impedance connected between said first terminal end of the VHF section and said second end of the UHF section to establish a continuous tuning relation between the UHF and VHF sections.

References Cited

UNITED STATES PATENTS

| | | | |
|---|---|---|---|
| 2,786,135 | 3/1957 | Garrigus | 325—459 |
| 2,806,945 | 9/1957 | Wingert | 325—458 |
| 2,817,064 | 12/1957 | Carlson | 333—24 |
| 2,859,419 | 11/1958 | Keiser | 334—43 |
| 2,954,469 | 9/1960 | Gelzer | 334—56 |

KATHLEEN H. CLAFFY, *Primary Examiner.*

R. P. TAYLOR, *Assistant Examiner.*